(12) United States Patent
Yin et al.

(10) Patent No.: US 11,594,608 B2
(45) Date of Patent: Feb. 28, 2023

(54) METHOD FOR FORMING GATE-ALL-AROUND NANOWIRE DEVICE

(71) Applicant: Institute of Microelectronics, Chinese Academy of Sciences, Beijing (CN)

(72) Inventors: Huaxiang Yin, Beijing (CN); Jiaxin Yao, Beijing (CN); Qingzhu Zhang, Beijing (CN); Zhaohao Zhang, Beijing (CN); Tianchun Ye, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/561,192

(22) Filed: Sep. 5, 2019

(65) Prior Publication Data
US 2020/0335596 A1    Oct. 22, 2020

(30) Foreign Application Priority Data
Apr. 19, 2019   (CN) .......................... 201910320171.5

(51) Int. Cl.
*H01L 29/423*     (2006.01)
*H01L 21/225*     (2006.01)
(Continued)

(52) U.S. Cl.
CPC ...... *H01L 29/42392* (2013.01); *H01L 21/225* (2013.01); *H01L 29/401* (2013.01); *H01L 29/66795* (2013.01); *H01L 29/785* (2013.01)

(58) Field of Classification Search
CPC ............. H01L 29/42392; H01L 21/225; H01L 29/401; H01L 29/66795; H01L 29/785
(Continued)

(56) References Cited

U.S. PATENT DOCUMENTS 6,855,606 B2     2/2005   Chen et al.
2015/0279933 A1  10/2015  Xiao et al.
(Continued)

FOREIGN PATENT DOCUMENTS

CN    103311305 A    9/2013
CN    104299905 A    1/2015
(Continued)

OTHER PUBLICATIONS

Chinese Office Action, dated Sep. 1, 2020.
(Continued)

*Primary Examiner* — Xia L Cross
(74) *Attorney, Agent, or Firm* — Goodwin Procter LLP

(57) ABSTRACT

A gate-all-around nanowire device and a method for forming the gate-all-around nanowire device. A first fin and a dielectric layer on the first fin are formed on a substrate. The first fin includes the at least one first epitaxial layer and the at least one second epitaxial layer that are alternately stacked. The dielectric layer exposes a channel region of the first fin. A doping concentration at a lateral surface of the channel region and a doping concentration at a central region of the channel region are different from each other in the at least one second epitaxial layer. After the at least one first epitaxial layer is removed from the channel region, the at least one second epitaxial layer in the channel region serves as at least one nanowire. A gate surrounding the at least one nanowire is formed.

2 Claims, 7 Drawing Sheets

Figure 1:
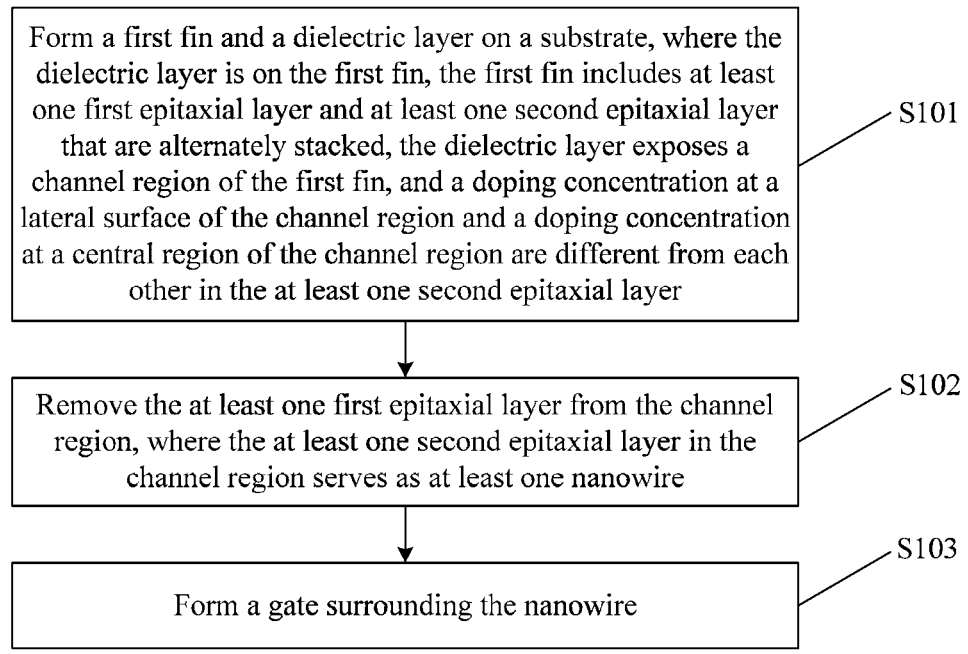

(51) Int. Cl.
     *H01L 29/40*          (2006.01)
     *H01L 29/66*          (2006.01)
     *H01L 29/78*          (2006.01)

(58) Field of Classification Search
     USPC .......................................................... 257/401
     See application file for complete search history.

(56) References Cited

U.S. PATENT DOCUMENTS

| | | | |
|---|---|---|---|
| 2017/0222007 A1 | 8/2017 | Colinge | |
| 2020/0058653 A1* | 2/2020 | Chiang | ........... H01L 21/823821 |
| 2020/0105893 A1* | 4/2020 | Xiao | ................... H01L 29/1045 |

FOREIGN PATENT DOCUMENTS

| | | |
|---|---|---|
| CN | 104952922 A | 9/2015 |
| CN | 107039499 A | 8/2017 |
| CN | 109103108 A | 12/2018 |
| JP | 2011029503 A | 2/2011 |
| KR | 20050053229 A | 6/2005 |
| TW | 200417026 A | 9/2004 |

OTHER PUBLICATIONS

Translation of Chinese Office Action dated Sep. 1, 2020.
Hou Zhaozhao et al.
Sarabdeep et al., A dopingless gate-all-around (GAA) gate-stacked nanowire FET with reduced parametric fluctuation effects, Journal of Computational Electronics, https://doi.org/10.1007/s10825-018-1166-0, published online Apr. 16, 2018.

\* cited by examiner

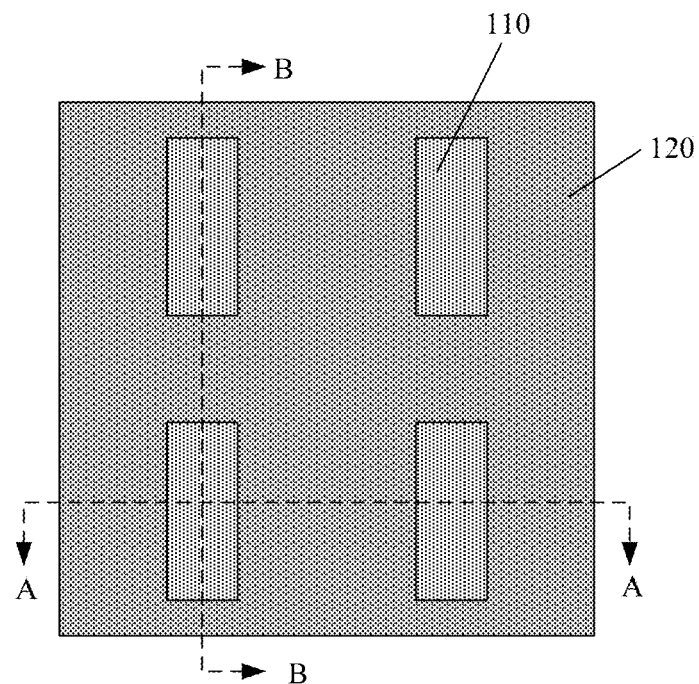
Figure 2
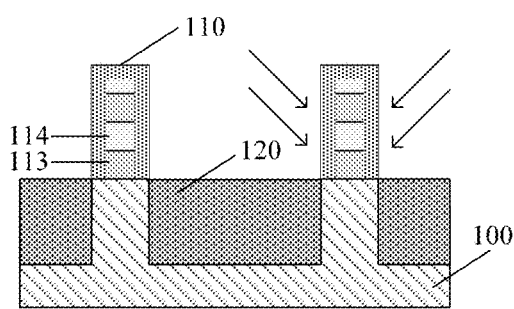 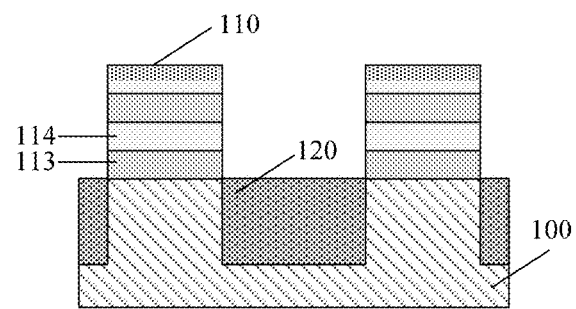
Figure 3A    Figure 3B

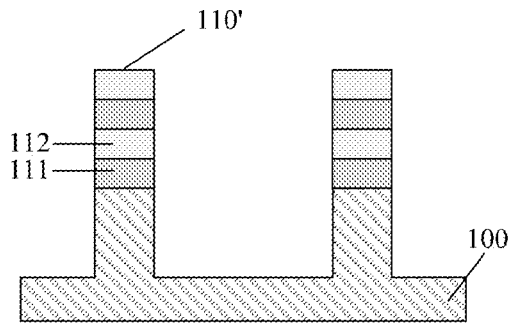 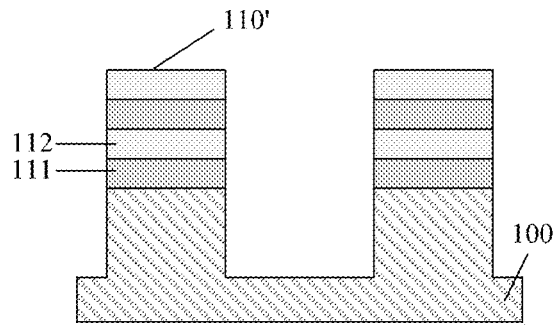
Figure 4A                     Figure 4B
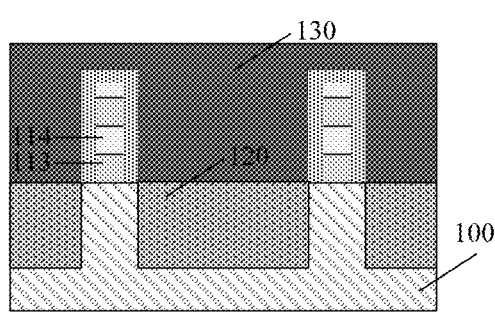 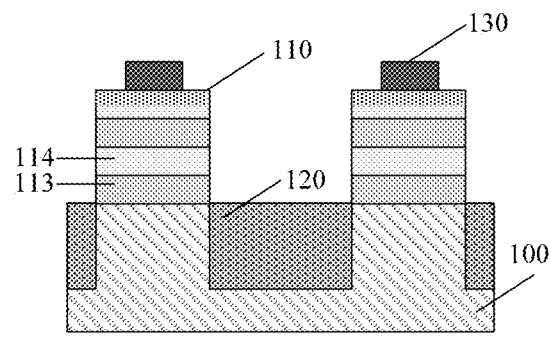
Figure 5A                     Figure 5B
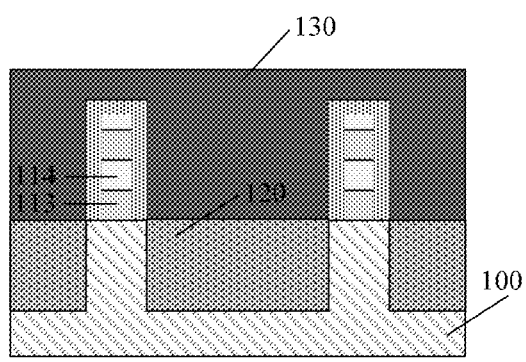 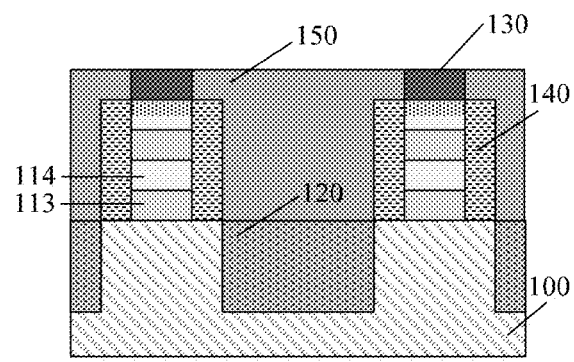
Figure 6A                     Figure 6B

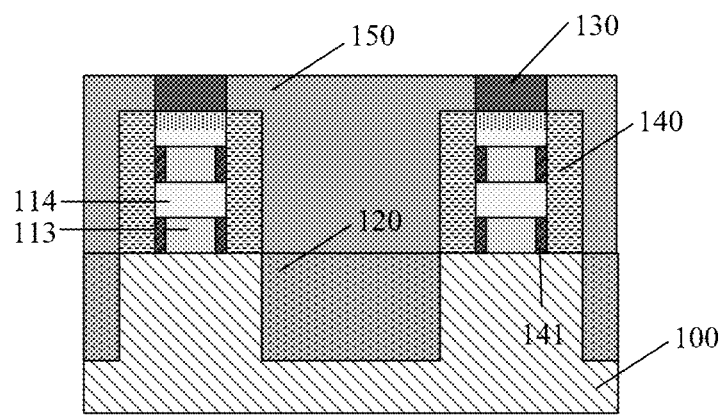
Figure 6C
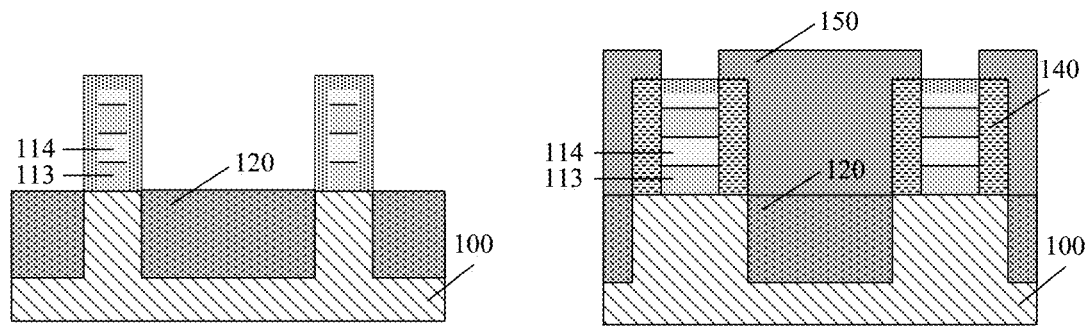
Figure 7AFigure 7B
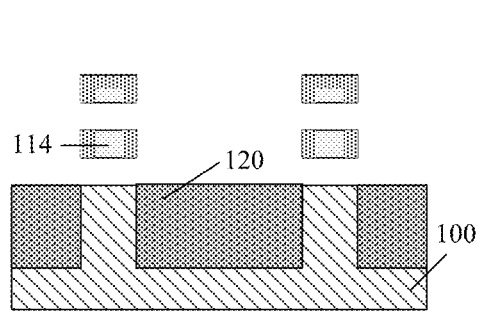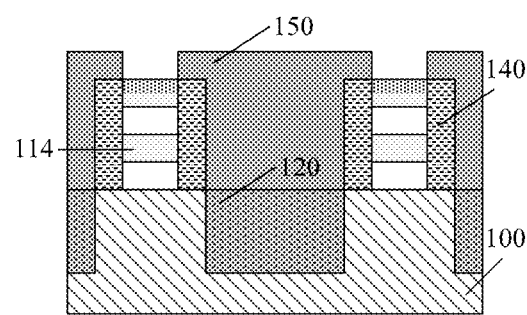
Figure 8AFigure 8B

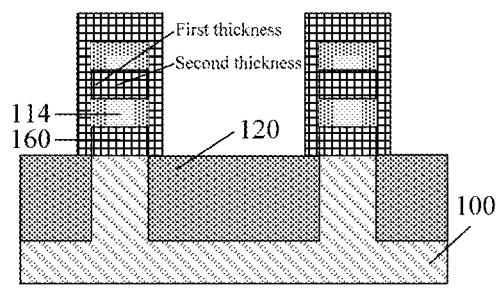
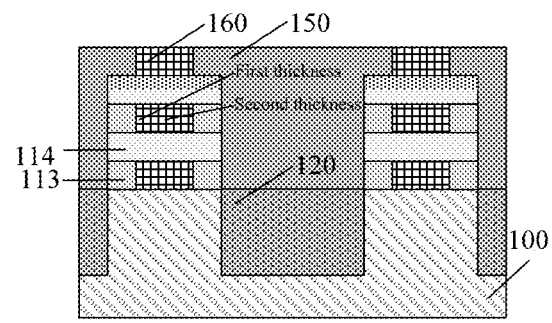
Figure 12A — Figure 12B
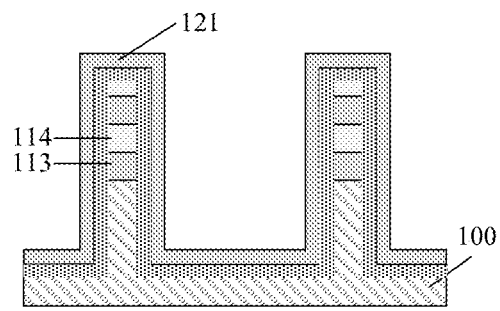
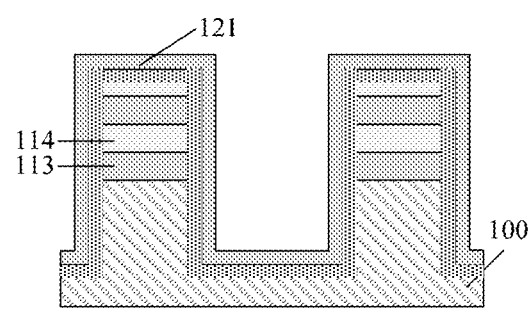
Figure 13A — Figure 13B
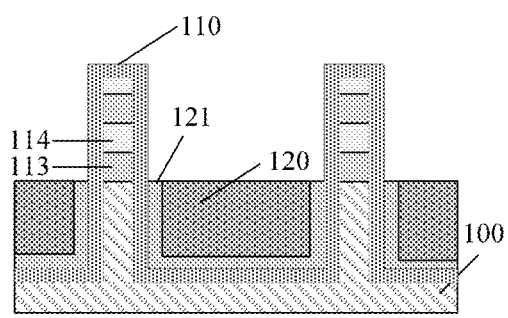
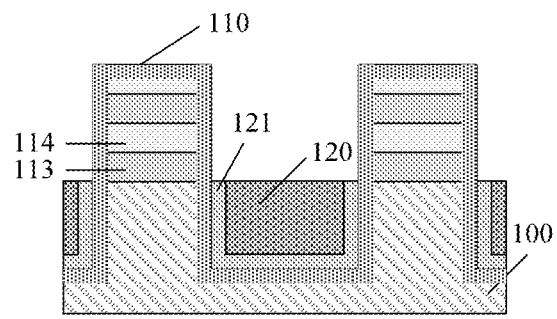
Figure 14A — Figure 14B

METHOD FOR FORMING GATE-ALL-AROUND NANOWIRE DEVICE

The present application claims priority to Chinese Patent Application No. 201910320171.5, titled "METHOD FOR FORMING GATE-ALL-AROUND NANOWIRE DEVICE", filed on Apr. 19, 2019 with the China. National Intellectual Property Administration, which is incorporated herein by reference in its entirety.

FIELD

The present disclosure relates to the technical field of semiconductor device and manufacture thereof, and in particular, to a method for forming a gate-all-around nanowire device.

BACKGROUND

With continuous development of techniques for manufacturing integrated circuits, a key dimension of a semiconductor device, especially a field effect transistor (MOSFET), is decreasing to reach a 5 nm and even lower technology node. A conventional tri-gate or double-gate fin field effect transistor (FinFET) is limited in sizes.

Gate-all-around (GAA) nanowire transistors become a hotspot in research and application. They feature in that a channel region of a nanowire is completely surrounded by a gate, thereby rendering good gate-control and driving capabilities. The GAA nanowire transistors are the most promising solution for CMOS devices in 10 nm and lower technology nodes. A channel region of the GAA nanowire transistors may be a nanowire-type or a nanosheet-type.

In conventional techniques for manufacturing the AA nanowire transistors, there is a problem that a turn-on voltage between the gate and a source distributes non-uniformly along the channel region. A decrease in a dimension of a channel may results in a severe narrow channel effect, thereby affecting device performances.

SUMMARY

In view of the above, an objective of the present disclosure is to provide a method for forming a gate-all-around (GAA) nanowire device, and form a nanowire with high carrier mobility.

To achieve the above objective, a method for forming a GAA nanowire device is provided according to an embodiment of the present disclosure, including:

forming a first fin and a dielectric layer on a substrate, where the dielectric layer is on the first fin, the first fin includes at least one first epitaxial layer and at least one second epitaxial layer that are alternately stacked, the dielectric layer exposes a channel region of the first fin, and a doping concentration at a lateral surface of the channel region and a doping concentration at a central region of the channel region are different from each other in the at least one second epitaxial layer;

removing the at least one first epitaxial layer from the channel region, where the at least one second epitaxial layer in the channel region serves as at least one nanowire; and forming a gate surrounding the at least one nanowire.

Optionally, forming the first fin and the dielectric layer on the substrate includes:

forming a second fin on the substrate, where the second fin includes at least one third epitaxial layer and at least one fourth epitaxial layer that are alternately stacked;

doping the second fin from a surface to obtain the first fin, where the at least one third epitaxial layer is doped to form the at least one first epitaxial layer of the first fin, and the at least one fourth epitaxial layer is doped to from the at least one second epitaxial layer of the first fin; and forming the dielectric layer on the first fin.

Optionally, doping the second fin from the surface to obtain the first fin includes:

forming a doping layer at the surface of the second fin, where the doping layer includes a dopant, and the dopant diffuses into the surface of the second fin to obtain the first fin; and removing the doping layer.

Optionally, forming the dielectric layer on the first fin includes:

forming a dummy gate that covers the channel region of the first fin;

forming source-or-drain regions in the first fin at two sides of the dummy gate;

forming the dielectric layer to cover the first fin at the two sides of the dummy gate; and removing the dummy gate to expose the channel region of the first fin.

Optionally, forming the dielectric layer on the first fin includes:

depositing a dielectric material layer; and etching the dielectric material layer, to expose the channel region of the first fin and form the dielectric layer;

where after forming the gate surrounding at least one nanowire, the method further includes:

removing the dielectric layer; and forming source-or-drain regions in the first fin at two sides of the dummy gate.

Optionally, forming the first fin and the dielectric layer on the substrate includes:

forming a second fin on the substrate, where the second fin includes at least one third epitaxial layer and at least one fourth epitaxial layer;

forming the dielectric layer on the second fin, where the dielectric layer exposes a pre-channel region of the second fin;

doping the second fin in the pre-channel region from a surface, to obtain the first fin, where the at least one third epitaxial layer is doped in the pre-channel region to form the at least one first epitaxial layer of the first fin, and the at least one fourth epitaxial layer is doped in the pre-channel region to form the at least one second epitaxial layer of the first fin;

where the pre-channel region forms the channel region through the doping.

Optionally, doping the second fin in the pre-channel region from the surface to obtain the first fin includes:

forming a doping layer at the surface of the second fin in the channel region, where the doping layer includes a dopant, and the dopant diffuses into the surface of the second fin in the pre-channel region, to obtain the first fin; and removing the doping layer.

Optionally, forming the dielectric layer on the second fin includes:

forming a dummy gate that covers the pre-channel region of the second fin;

forming source-or-drain regions in the second fin at two sides of the dummy gate;

covering the second fin at the two sides of the dummy gate, to form the dielectric layer; and removing the dummy gate to expose the pre-channel region of the second fin.

Optionally, forming the dielectric layer on the second fin includes:

depositing a dielectric material layer; and etching the dielectric material layer, to expose the pre-channel region of the second fin and form the dielectric layer;

where after forming the gate surrounding the nanowire, the method further includes:

removing the dielectric layer; and forming source-or-drain regions in the first fin at two sides of the gate.

Optionally, the doping from the surface is performed through at least one of ion implantation doping, plasma doping, or epitaxial growth.

A GAA nanowire device is further provided according to an embodiment of the present disclosure, including:

a substrate;

a first fin on the substrate, where a channel region of the first fin includes at least one first epitaxial layer and at least one second epitaxial layer that are alternately stacked, and a doping concentration at a lateral surface of the channel region and a doping concentration at a central region of the channel region are different from each other in the at least one second epitaxial layer; and a dielectric layer, covering the first fin at a location other than the channel region.

Optionally, source-or-drain regions are formed beneath the dielectric layer.

The GAA nanowire device and a method for forming the GAA nanowire device are provided according to embodiments of the present disclosure. The first fin and the dielectric layer on the first fin are formed on the substrate. The first fin includes the at least one first epitaxial layer and the at least one second epitaxial layer that are alternately stacked. The dielectric layer exposes the channel region of the first fin. The doping concentration at the lateral surface of the channel region and the doping concentration at the central region of the channel region are different from each other in the at least one second epitaxial layer. For example, the doping concentration at the lateral surface is higher or lower than the doping concentration at the central region in the at least one second epitaxial layer. After the at least one first epitaxial layer is removed from the channel region, the at least one second epitaxial layer in the channel region serves as the at least one nanowire. A gate surrounding the at least one nanowire is formed. Thereby, doping concentrations at different positions in the at least one nanowire are different, so that a non-uniform turn-on voltage due to a non-uniform thickness of the gate surrounding the at least one nanowire can be adjusted, and a device performance can be improved.

BRIEF' DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

FIG. 1 is a flowchart of a method for forming a gate-all-around nanowire device according to an embodiment of the present disclosure;

FIG. 2 is a top view after forming a fin in a method for forming a gate-all-around nanowire device according to an embodiment of the present disclosure; and FIG. 3A-15B are schematic structural views in a process of forming a gate-all-around nanowire device based on a method according to an embodiment of the present disclosure, where figures denoted by "A" are cross-sectional views along line AA in FIG. 2, and figures denoted by "B" or "C" are cross-sectional views along line BB in FIG. 2.

DETAILED DESCRIPTION OF EMBODIMENTS

To make objectives, technical solutions and advantages of the present disclosure clearer, the technical solutions according to the embodiments of the present disclosure are described in detail as follows in conjunction with the drawings.

Various specific details are described in following description to facilitate a full understanding of the present disclosure. The present disclosure may be implemented in other manners different from what is described herein. Those skilled in the art can make similar analogies without deviating from a concept of the invention, and thereby the present disclosure is not limited to specific embodiments disclosed hereinafter.

Description is in conjunction with the drawings in the present disclosure. In detailed description for embodiments of the present disclosure, a cross-sectional view of parts of a device structure is not enlarged to general scale, so as to facilitate illustration. A schematic diagram is only exemplary, and the protection scope of the present disclosure should not be limited thereto. In addition, three-dimensional spatial dimensions in length, width and depth should be included in practical manufacture.

A three-dimensional transistor may be formed by stacking nanowires, and a channel region of the nanowires is completely surrounded by a gate, so as to achieve gate-control and driving capabilities. In a fabrication process of a conventional gate-all-around (GAA) nanowire transistor, a thickness of the gate surrounding the channel is typically not uniform. A thickness of the gate at a top and a bottom of the channel is relevant to a distance between adjacent channels, and a thickness of the gate at two lateral sides of the channel is relevant to a fabrication technique of the gate. Taking a direction parallel to a surface of a substrate as horizontal, a thickness of a horizontal portion of the gate and a thickness of a vertical portion of the gate may not be equal. Further, in a case that the channel has an edge or a corner, the gate is thicker at a surface of the edge or the corner The thickness of the gate surrounding the channel influences a work function of the gate at a corresponding location. Therefore, the non-uniform thickness of the gate results in that a turn-on voltage between the gate and a source is distributed non-uniformly among different positions of the channel, thereby affecting a device performance. In particular, an influence of the thickness of the gate on the device performance becomes more and more obvious with a decreasing dimension of the channel, resulting in a severe narrow channel effect, Thereby, the device performance is seriously affected.

The GAA nanowire device and a method for forming the GAA nanowire device are provided according to embodiments of the present disclosure. A first fin and a dielectric layer on the first fin are formed on a substrate. The first tin includes at least one first epitaxial layer and at least one second epitaxial layer that are alternately stacked. The dielectric layer exposes a channel region of the first fin. A doping concentration at a lateral surface of the channel region and a doping concentration at a central region of the channel region are different from each other in the at least one second epitaxial layer. For example, the doping concentration at the lateral surface is higher or lower than the doping concentration at the central region in the at least one second epitaxial layer. After the at least one first epitaxial layer is removed from the channel region, the at least one second epitaxial layer in the channel region serves as at least one nanowire. A gate surrounding the at least one nanowire is formed. Thereby, doping concentrations at different positions in the at least one nanowire are different, so that a non-uniform turn-on voltage due to a non-uniform thickness of the gate surrounding the at least one nanowire can be adjusted, and a device performance can be improved.

For better understanding of technical solutions of the present disclosure, hereinafter specific embodiments are described and illustrated in detail in conjunction with a flowchart in FIG. 1, FIG. 2, and FIGS. 3A to 15B.

Reference is made to FIG. 1, which is a method for forming a GAA nanowire device according to an embodiment of the present disclosure. The method may include steps S101 to S103.

In S101, a first fin 110 and a dielectric layer 150 are formed on a substrate 100, where the dielectric layer 150 is on the first fin 110, as shown in FIGS. 2 to 7B.

The first fin 110 includes at least one first epitaxial layer 113 and at least one second epitaxial layer 114 that are alternately stacked. A doping concentration at a lateral surface of a channel region and a doping concentration at a central region of the channel region are different from each other in the at least one second epitaxial layer 114. The dielectric layer 150 exposes the channel region of the first fin 110.

In one embodiment, the substrate 100 may be a Si substrate, a Ge substrate, a SiGe substrate, an SOI (silicon on insulator), a GOI (germanium on insulator), a III-V compound semiconductor, a II-VI compound semiconductor, or the like. In other embodiments, the substrate 100 may be a substrate including another elemental semiconductor or compound semiconductor, such as GaAs, InP, or SiC. The substrate may be a stacked structure, such as Si/SiGe. The substrate may be other epitaxial structures, such as SGOI (silicon-germanium on insulator). The semiconductor substrate may be n-type or p-type doped. In one embodiment, the substrate 100 is a bulk silicon substrate.

The first fin 110 is formed on the substrate 100, and the formed first fin 110 may include the at least one first epitaxial layer 113 and the at least one second epitaxial layer 114 that are alternately stacked. It should be noted that, in the figures illustrating embodiments, FIGS. 2, 3A and 3B are schematic diagrams after the first fin 110 is formed. FIG. 2 is a top view, FIG. 3A is a cross-sectional view along line AA in FIG. 2, and FIG. 3B is a cross-sectional view along line BB in FIG. 2. In FIGS. 4A to 11B that are illustrated hereinafter, top views for corresponding steps are omitted, and only the cross-sectional views along different directions for the corresponding steps are shown. Directions for the cross-sectional views refer to FIG. 2. In figures denoted by "A", the cross-sectional view is along the AA direction in FIG. 2. In figures denoted by "B" or "C", the cross-sectional view is along the BB direction in FIG. 2.

The first epitaxial layer 113 may be a germanium-based film layer, and the second epitaxial layer 114 may be an epitaxial silicon layer. Specifically, the germanium-based film layer may be an epitaxial germanium layer or an epitaxial silicon-germanium layer. The epitaxial silicon-germanium layer may be a germanium layer and a silicon-germanium layer that are stacked, or may be a silicon-germanium layer, a germanium layer, and a silicon-germanium layer that are sequentially stacked. The silicon-germanium layer may be used as a transition layer between the germanium layer and the silicon layer, so as to reduce a difficulty in epitaxy and improve a quality in epitaxy. It is further appreciated that the second epitaxial layer may be a binary or ternary compound semiconductor material, such as $In_{1-x}Ga_xAs$ or $In_{1-x}Al_xAs$, as long as there is selectivity between the first epitaxial layer and the second epitaxial layer in etching.

Since the nanowire formed in the GAA nanowire device may be in a structure of spaced multiple layers that are stacked, there may be multiple first epitaxial layers 113 or multiple second epitaxial layers 114. Specifically, the first epitaxial layer 113 serves as a sacrificial layer, and a quantity of the second epitaxial layers 114 determines a quantity of the nanowires. Thereby, a quantity of the second epitaxial layers 114 is same as the quantity of layers for the nanowires.

An aperture of the formed nanowire is determined based on a thickness of the second epitaxial layer 114. Therefore in forming the nanowires, the second epitaxial layers 114 may have different thicknesses in different regions, so as to form nanowires with different apertures. The first epitaxial layer 113 may have different thicknesses to control a space between the nanowires.

In one embodiment, the doping concentration at the lateral surface of the channel region and the doping concentration at the central region of the channel region are different from each other in the at least one second epitaxial layer 114. Reference is made to FIG. 3A. It is appreciated that in a process of forming the second epitaxial layer 114, a doping concentration at a top surface of the channel region in the topmost second epitaxial layer 114 may also be different from the doping concentration at the central region in the at least one second epitaxial 114, or a doping concentration at a surface of another region other than the channel region of the first fin 110 is different from the doping concentration at the central region in the at least one second epitaxial 114, which does not hinder implementation of this embodiment.

In order to form the first fin 110 on the substrate 100, a second fin 110' including at least one third epitaxial layer Iii and at least one fourth epitaxial layer 112 may he formed on the substrate 100 in advance. Referring to FIGS. 4A and 4B, the second fin 110' is doped from a surface. The doped at least one third epitaxial layer 111 serves as the at least one first epitaxial layer 113, and doping concentrations at a lateral surface and a central region are different from each other in the at least one first epitaxial layer 113. The doped at least one fourth epitaxial layer 112 serves as the at least one second epitaxial layer 114, and the doping concentrations at the lateral surface and the central region are different from each other in the at least one second epitaxial layer 114. The at least one first epitaxial layer 113 and the at least one second epitaxial layer 114 are included in the first fin 110.

It can be understood that the first fin 110 and the second fin 110' are different in being doped or not. The first fin 110 is the doped second fin 110', and they are identical in shapes and quantities.

In implementation, the third epitaxial layer 111 may be grown on the substrate 100 in epitaxy, and then the fourth epitaxial layer 112 may be grown on the third epitaxial layer 111 in epitaxy. The epitaxy may be reduced pressure epitaxy or molecular beam epitaxy.

After growing the third epitaxial layer 111 and the fourth epitaxial layer 112 on the substrate 100, the third epitaxial layer 111 and the fourth epitaxial layer 112 cover the entire substrate 100. The third epitaxial layer 111 and the fourth epitaxial layer 112 that are out of a region in which the second fin 110' is located are removed by etching based on a pattern of a hard mask, so as to form the second fin 110'. There may be multiple second fins 110' in correspondence to multiple devices that are formed. The hard mask may be silicon nitride, silicon oxide, or silicon nitride and silicon oxide that are stacked.

In patterning the third epitaxial layer 111 and the fourth epitaxial layer 112, the substrate 100 may be over-etched, so that the second fin 110' includes a portion of a substrate material.

It can be understood that an isolation structure 120 may be formed among the multiple second fins 110'. Namely, there is the isolation structure 120 among the multiple first fins 110. The isolation structure 120 may be a shallow-trench isolator. .An isolation material such as silicon oxide may be deposited, planarized, and etched back, so as to form the isolation structure 120, as shown in FIGS. 3A and 3B.

After the second fin 110' is formed, the second fin 110' may be doped from a surface to obtain the first fin 110. The doping may be performed through ion implantation doping, plasma doping, a doping layer grown in epitaxy, diffusion doping, or other manners. Those skilled in the art can select a doping manner based on an actual demand. Processes corresponding to various doping techniques may refer to following description.

A dopant for the doping and a dopant in the second epitaxial layer 114 may have like charges, and the doping concentration at the surface is greater than the doping concentration at the central region in the second epitaxial layer 114. The dopant for the doping and the dopant in the second epitaxial layer 114 may have unlike charges, and the doping concentration at the surface is smaller than the doping concentration at the central region in the second epitaxial layer 114.

Doping the second fin 110' from the surface is to address an issue of the non-uniform turn-on voltage due to the non-uniform thickness of the gate surrounding the nanowire. Thus, the doping concentration may be determined according to a practical situation. For most gate materials, a large thickness leads to a large turn-on voltage of the device. In such case, a high doping concentration is provided at a position where the gate material is thick, so as to reduce the turn-on voltage of the device. A low doping concentration is provided at a position where the gate material is thin, so as to increase the turn-on voltage of the device. For a few gate materials, a large thickness leads to a small turn-on voltage of the device. In such case, a low doping concentration is provided at a position where the gate material is thick, so as to increase the turn-on voltage of the device. A high doping concentration is provided at a position where the gate material is thin, so as to reduce the turn-on voltage of the device.

As an example, reference is made to the nanowires shown in FIG. 3A. Generally, the gate material formed at a left side and a right side of nanowires is thick. The dopant may be same as the doping material in the second epitaxial layer 114. Namely, the doping concentration at the left lateral surface and at the right lateral surface of the nanowires is higher, so as to balance an effect of the thickness of the gate material on the turn-on voltage of the device.

The dielectric layer 150 may be formed on the first fin 110. The dielectric layer 150 may be formed on a top and sidewalls of the first fin 110, except for a top and sidewalls of the channel region, so as to protect regions other than the channel region of the first fin 110 in the subsequent processes. A material of the dielectric layer 150 may be, for example, undoped silicon oxide ($SiO_2$), doped silicon oxide (such as borosilicate glass and borophosphosilicate glass), silicon nitride ($Si_xN_4$), or other low-k dielectric materials.

In this embodiment, the second fin 110' may be formed on the substrate 100, the second fin 110' may be doped from the surface to obtain the first fin 100, and the dielectric layer 150 is further formed the first fin 100. It can be understood that in one embodiment, the second fin 110' may be firstly doped from the surface to obtain the first fin 110, and then the dielectric layer 150 is formed on the first fin 100. Alternatively, the dielectric layer 150 may be firstly formed on the second fin 110', and then the second fin 110' may be doped at a pre-channel region (which forms the channel region through the doping) exposed by the dielectric layer 150, thereby obtaining the first fin 110 of which only the channel region is doped. A sequence of the doping and forming the dielectric layer 150 is not limited herein.

In a gate-last process, source-or-drain regions 140 may be formed in the first fin 110 at regions other than the channel region, before the dielectric layer 150 is formed.

As an example, the dielectric layer 150 is formed on the first fin 110. A dummy gate 130 covering the channel region of the first fin 110 may be firstly formed, as shown in FIGS. 5A and 5B. The dummy gate 130 is located at a gate region of the finished device. The dummy gate 130 covering the channel region of the first fin 110 may be formed by deposition and etching. The dummy gate 130 may be made of, for example, polysilicon. Sidewalls (not shown in the figures) may be formed at two sides of the dummy gate 130. The sidewalls may be a single-layer or multi-layer structure. The sidewalls may be formed by one or a combination of silicon nitride, silicon oxide, silicon oxynitride, silicon carbide, fluoride doped silicon glass, and low-k dielectric materials, and/or other suitable materials. The sidewalk may he formed by depositing a sidewall material and performing an anisotropic etching.

After the dummy gate 130 is formed, the source-or-drain regions 140 may be formed at two sides of the dummy gate 130. The source-or-drain regions 140 may be formed through ion implantation, epitaxial growth, or other suitable means. In a case that the source-or-drain regions 140 are formed through ion implantation and surfaces at two sides of the first epitaxial layer 113 and the second epitaxial layer 114 of the channel region have been doped, a doping concentration in the formed source-or-drain regions 140 is much higher than the doping concentration of the aforementioned doping from the surface, so as to increase carrier mobility in the channel region of the device. Therefore, the doping from the surface of the first fins 110 does not influence forming the source-or-drain regions 140.

In this embodiment, the source-or-drain regions 140 may be formed through epitaxial growth. The first fin 110 may be etched by using the dummy gate 130 and the sidewalls at the two sides of the dummy gate 130 as a mask, so as to remove the first fin 110 that is not covered by the dummy gate 130 or the sidewalls at the two sides of the dummy gate 130. The first epitaxial layer 113, in the first fin 110 covered by the dummy gate 130 and the sidewalls on the two sides of the dummy gate 130, is over-etched. Thereby, the first epitaxial layer 13 is concaved with respect to the sidewalls at the two sides of the dummy gate 130.

An inner wall 141 may be formed at a concave of the first epitaxial layer 113 through a sidewall-forming technique.

The source-or-drain regions 140 may be grown on two sides of the first fin 100 The inner wall 141 separates the source-or-drain regions 140 from the first epitaxial layer 113 of the first fin 110. Reference is made to FIG. 6C, where a cross-section in FIG. 6C is along line BB in FIG. 2. Therefore in this embodiment, the inner wall 141 can protect the source-or-drain regions 140 when the first epitaxial layer 113 is etched in a process of forming the nanowires. The inner wall 141 may be made of any combination of silicon nitride, silicon oxide, silicon oxynitride, silicon carbide, fluoride doped silicon glass, and the like.

After the source-or-drain regions 140 are formed in the first fins 110 on the two sides of the dummy gate 130, the dielectric layer 150 may be formed to cover the source-or-drain regions 140 at the two sides of the dummy gate 130. The dielectric layer 150 can protect the source-or-drain regions 140 beneath the dielectric layer 150, as shown in FIGS. 6A and 6B. The dielectric layer 150 may be deposited by an appropriate deposition method, and the deposited dielectric layer 150 covers each first fin 110 and the isolation structure 120. The deposited dielectric layer 150 is planarized, for example, by chemical mechanical polish (CMP), to expose the dummy gate 130.

After the dielectric layer 150 is formed, the dummy gate 130 may be removed to expose the channel region of the first fin 110, as shown in FIGS. 7A and 7B. The dummy gate 130 may be removed by wet etching and/or dry etching, so as to expose the channel region of the fin 110.

In one embodiment, the dielectric layer 150 may be firstly formed on the second fin 110', and the second fin 110' is doped in the pre-channel region exposed by the dielectric layer 150, to obtain the first fin 110 of which only the channel region is doped. In such process, the dummy gate 130 covering the channel region of the second fin 110,' and the sidewalls at the two sides of the dummy gate 130, may be firstly formed. The source-or-drain regions 140 are formed in the second fin 110' at two sides of the dummy gate 130. Then, the dielectric layer 150 covering the source-or-drain regions 140 is formed. A process of forming the dummy gate 130, the sidewalls on the two sides of the dummy gate 130, and the source-or-drain regions 140 may refer to the foregoing description, which is not described herein.

After the dielectric layer 150 is formed, the dielectric layer 150 exposes the pre-channel region, and thereby only the second fin 110' in the pre-channel region may be doped from a surface to obtain the first fin 110. A specific process of doping may refer to the process of doping the entire the second fin 110' from the surface to obtain the first fin 100. Namely, in one embodiment, the surface of the first fin 110 located in the channel region is doped in advance, and a surface of other regions outside the channel region may or may not be doped in advance.

In S102, the at least one first epitaxial layer 113 is removed from the channel region, where the at least one second epitaxial layer 114 in the channel region serves as at least one nanowire, as shown in FIGS. 8A and 8B.

Since the region other than the channel region of the first fin 110 is covered with the dielectric layer 150. the at least one first epitaxial layer 113 may be removed from the channel region with the dielectric layer 150 as a mask. In a case that the inner wall 141 is formed between the at least one first epitaxial layer 113 and the source-or-drain regions 140, the inner wall protects the source-or-drain regions 140. In a case that the first epitaxial layer 113 is a germanium-based film layer, the ruthenium-based film layer may be wet-etched. For example, a mixed solution of hydrogen peroxide ($H_2O_2$), hydrofluoric acid (HF) and acetic acid ($CH_3COOH$) may be used for etching. Or, the ruthenium-based film layer may be etched through gas molecule reaction. For example, the ruthenium-based layer is etched by chloric acid (HCl) gas at a high temperature.

In one embodiment, the first epitaxial layer 113 may be removed through multiple oxidation-removal processes. In one oxidation-removal process, an oxidation process may be firstly performed on the first epitaxial layer 113, and then the oxidized first epitaxial layer 113 may be removed. In such process, the first epitaxial layer 113 is oxidized more greatly than the second epitaxial layer 114, and an oxidant may be oxygen ($O_2$) or ozone ($O_3$). After the first epitaxial layer 113 is oxidized, generated oxide may be etched using an etching gas, so as to remove the first epitaxial layer 113.

It is appreciated that after the at least one first epitaxial layer 113 is removed, a shape of the at least one second epitaxial layer 114 may be modified, so that the shape of the second epitaxial layer 114 meets a practical requirement. The modified second epitaxial layer 114 serves as the nanowire. In one embodiment, a cross-section of the nanowire may be rectangular, circular, elliptical, or other shapes along the AA direction.

Figure 9A:
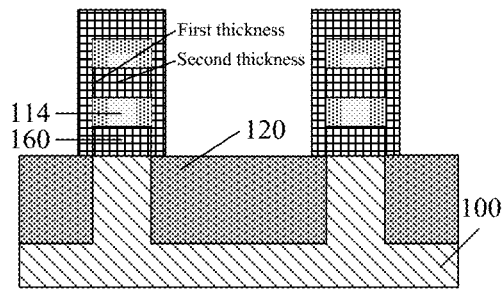
Figure 9B:
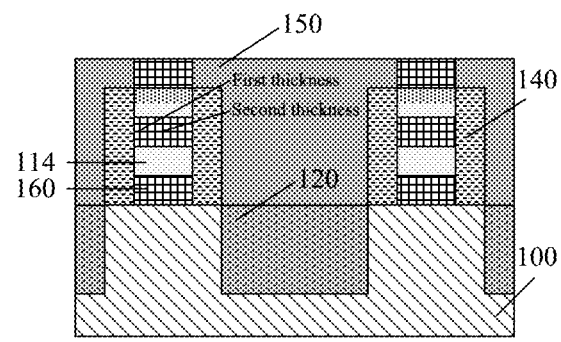

In S103, a gate 160 surrounding the nanowire is formed, as shown in FIGS. 9A and 9B.

The gate 160 may be made of metal. A structure of the gate 160 may include one or more layers. A material of the gate 160 may include one or a combination of a metal material and polysilicon. The metal material may be, for example, one or more of Ti, $TiAl_x$, TiN, TaNx, HfN, $TiC_x$, $TaC_x$, TiNSi, Al, TiAl, $TiAlC_x$, and the like.

It is appreciated that before the gate 160 is formed, a gate dielectric layer surrounding the nanowires may be formed. The gate dielectric layer may be a high-k dielectric material (for example, a material with higher dielectric constant than silicon oxide), or another appropriate dielectric material. The high-k dielectric material includes, for example, one or more of hafnium-based oxide, $HFO_2$, HfSiO, HfSiON, HfTaO, HfTiO, $ZrO_2$, $Al_2O_3$, $La_2O_3$, and the like.

The GAA nanowire device and a method for forming the GAA nanowire device are provided according to embodiments of the present disclosure. The first fin and the dielectric layer on the first fin are formed on the substrate. The first fin includes the at least one first epitaxial layer and the at least one second epitaxial layer that are alternately stacked. The dielectric layer exposes the channel region of the first fin. The doping concentration at the lateral surface of the channel region and the doping concentration at the central region of the channel region are different from each other in the at least one second epitaxial layer. For example, the doping concentration at the lateral surface is higher or lower than the doping concentration at the central region in the at least one second epitaxial layer. After the at least one first epitaxial layer is removed from the channel region, the at least one second epitaxial layer in the channel region serves as the at least one nanowire. A gate surrounding the at least one nanowire is formed. Thereby, doping concentrations at different positions in the at least one nanowire are different, so that a non-uniform turn-on voltage due to a non-uniform thickness of the gate surrounding the at least one nanowire can be adjusted, and a device performance can be improved.

It should be noted that the gate-last process is taken as an example in illustrating the aforementioned embodiments. The second fin 110' is doped to obtain the first fin 110, achieving an effect that the doping concentration at the lateral surface of the channel region is different from the doping concentration at the central region of the channel region in the at least one second epitaxial layer 114. Such effect is also applicable to a gate-first process.

Figure 10A:
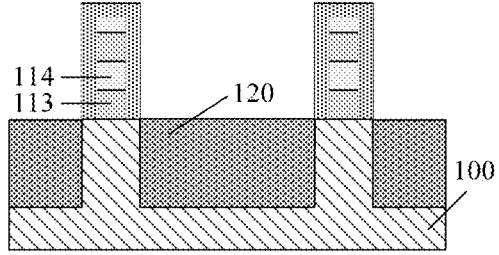
Figure 10B:
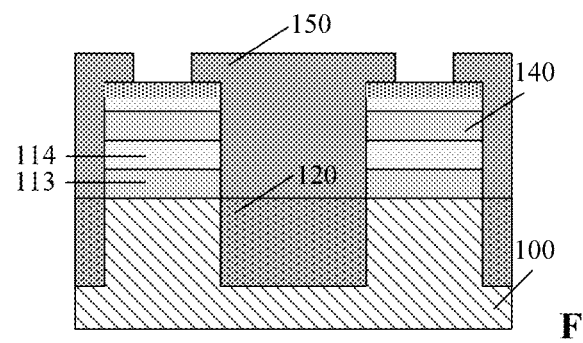

In the gate-first process, the source-or-drain regions 140 are not included in the second fin 110' that is beneath the formed dielectric layer 150. Reference is made to FIGS. 10A and 10B. Therefore, the dummy gate 130 may not be formed before the dielectric layer 150 is formed. Rather, a dielectric material layer is etched after being deposited, and the channel region of the first fin 110 or the pre-channel region of the second fin 110' is exposed, thereby obtaining the dielectric layer 150.

Similarly, a sequence of doping the second fin 110' and forming the dielectric layer 150 is not strictly limited. The second fin 110' may be firstly doped to obtain the first fin 110, and then the dielectric material layer is deposited to obtain the dielectric layer 150. Or, the dielectric layer 150 may be firstly formed on the second fin 110, and then the pre-channel region of the second fin 110' may be doped from the surface.

Figure 11A:
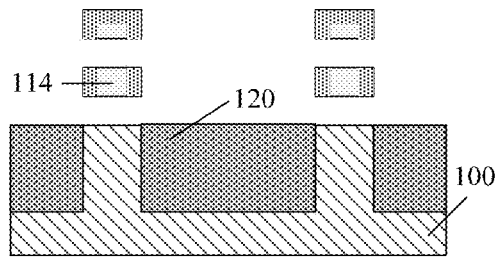
Figure 11B:
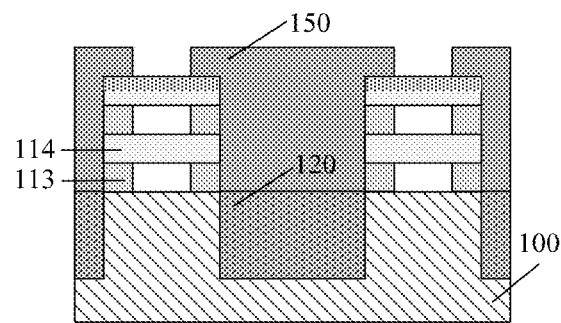

After the dielectric layer 150 is formed, the at least one first epitaxial layer 113 may be removed with the dielectric layer 150 as a mask, and the at least one second epitaxial layer 114 serves as at least one nanowire, as shown in FIGS. 11A and 11B. Then, the gate 160 surrounding the nanowire is formed, as shown in FIGS. 12A and 12B. After the gate 160 is formed, the dielectric layer 150 is removed, and the source-or-drain regions (not shown in the figure) are formed on two sides of the first fin 100. A process of removing the at least one first epitaxial layer 113, forming the gate 160 surrounding the nanowire, and forming the source-or-drain regions may refer to description of the aforementioned embodiments, which is not repeated herein.

In the gate-first process, doping concentrations are different at different positions in the nanowire, so that the non-uniform turn-on voltage due to the thickness of the gate 160 can be adjusted to improve a device performance.

Hereinafter processes of doping the second fin 110' through a doping technique to obtain the first fin 110 is described in detail.

In one embodiment, the at least one second epitaxial layer 114 is formed through ion implantation doping or plasma doping on the second fin 110', as shown in FIGS. 3A and 3B. An angle of ion implantation or an angle of acting plasma may refer to directions of arrows in FIG. 3A.

In another embodiment, the at least one second epitaxial layer is formed by epitaxial growth on the surface of the second fin 110' (not shown in the figure). The surface of the second fin 110' may be etched to concave the second tin 110', and then a doping material layer with a doping concentration different from that in the second fin 110' is formed by epitaxial growth. The doping material layer and the second tin 110' together form the first fin 110.

In another embodiment, the at least second epitaxial layer 114 is formed through diffusion-doping from the surface of the second fin 110', as shown in FIGS. 13A to 15B.

After the second fin 110' is formed on the substrate 100, a doping layer 121 may be deposited as shown in FIGS. 13A and 13B, The doping layer 121 includes a dopant, and thereby the dopant can diffuse from the doping layer 121 into the surface of the second fin 110', so as to form the first fin 110. Then, the doping layer 121 on the surface of the first fin 110 is removed.

It is appreciated that in one embodiment, the isolation structure 120 may be formed among the second fins 110', so that the doping layer 121 does not contact the substrate 100. Or, the isolation structure 120 may be formed on the doping layer 121, the isolation structure 120 exposes the first fin 110, and the doping layer 121 beneath the isolation structure 120 is retained, as shown in FIGS. 14A and 14B.

Figure 15A:
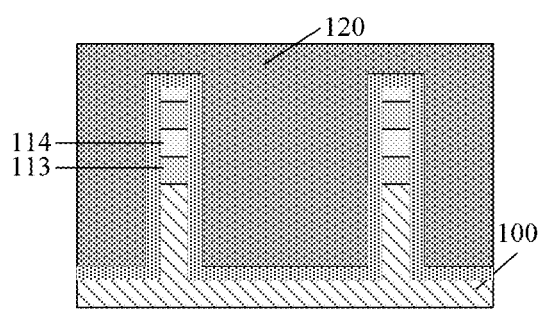
Figure 15B:
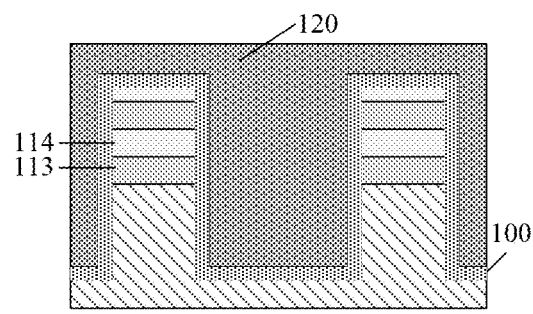

In one embodiment, the doping layer 121 may serve as the isolation structure 120. In such case, an isolation material including a dopant may be deposited, and the dopant in the isolation material may diffuse into the surface of the second fin 110' to form a first fin 110, as shown in FIGS. 15A and 15B. Then, the isolation material is etched to form the isolation structure 120.

A GAA nanowire device is further provided according to an embodiment of the present disclosure, and the GAA nanowire device can be manufactured through the aforementioned method for forming the GAA nanowire device. Referring to FIGS. 9A and 9B, the GAA nanowire device according to an embodiment of the present disclosure may include a substrate, a first fin on the substrate, and a dielectric layer.

A channel region of the first fin includes at least one first epitaxial layer and at least one second epitaxial layer that are alternately stacked. A doping concentration at a lateral surface of the channel region and a doping concentration at a central region of the channel region are different from each other in the at least one second epitaxial layer.

The dielectric layer covers the first fin at a location other than the channel region.

Optionally, source-or-drain regions are formed beneath the dielectric layer.

The foregoing embodiments are only preferable embodiments of the present disclosure, and do not limit the present disclosure in any form. The preferable embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure.

The invention claimed is:

1. A gate-all-around nanowire device, comprising:
a substrate;
a first fin on the substrate, wherein a channel region of the first fin comprises at least one gate and at least one second epitaxial layer that are alternately stacked; and
a dielectric layer, covering the first fin at a location other than the channel region;
wherein doping concentrations in the at least one second epitaxial layer in a direction perpendicular to the substrate are substantially the same;
wherein in a direction parallel to the substrate, a doping concentration at a lateral surface of the channel region and a doping concentration at a central region of the channel region are different from each other in the at least one second epitaxial layer;
wherein the at least one gate surrounding the at least one second epitaxial layer and having different thickness, wherein a doping concentration in the at least one second epitaxial layer at a position where at least one gate around has a first thickness is greater than a doping concentration in the at least one second epitaxial layer at a position where the at least one gate around has a second thickness; and wherein the first thickness is greater than the second thickness.

2. The gate-all-around nanowire device according to claim 1, wherein source-or-drain regions are formed beneath the dielectric layer.

\* \* \* \* \*